United States Patent [19]

Torigoe

[11] Patent Number: 5,286,963
[45] Date of Patent: Feb. 15, 1994

[54] PROJECTION EXPOSURE APPARATUS AND METHOD, A SEMICONDUCTOR DEVICE MANUFACTURING SYSTEM AND METHOD, AND A SEMICONDUCTOR DEVICE MANUFACTURED BY ILLUMINATING AN ORIGINAL HAVING A CIRCUIT PATTERN WHEN THE ORIGINAL AND A WAFER ARE IN A FOCUSED STATE

[75] Inventor: Makoto Torigoe, Tokyo, Japan

[73] Assignee: Canon Kabushiki Kaisha, Tokyo, Japan

[21] Appl. No.: 925,878

[22] Filed: Aug. 7, 1992

[30] Foreign Application Priority Data

Aug. 9, 1991 [JP] Japan .................. 3-225220

[51] Int. Cl.⁵ .............................................. G01J 1/20
[52] U.S. Cl. .................................. 250/201.2; 355/53
[58] Field of Search ............... 250/201.2, 201.5, 201.8, 250/201.6, 548, 561; 356/400, 401, 376, 375, 372; 355/53, 54, 55, 56, 57, 52

[56] References Cited

U.S. PATENT DOCUMENTS

| | | | |
|---|---|---|---|
| 4,498,742 | 2/1985 | Uehara . | |
| 4,653,903 | 3/1987 | Torigoe et al. | 355/53 |
| 4,682,885 | 7/1987 | Torigoe | 355/67 |
| 4,711,568 | 12/1987 | Torigoe et al. | 355/53 |
| 4,875,076 | 10/1989 | Torigoe et al. | 355/53 |
| 4,964,720 | 10/1990 | Torigoe | 353/122 |
| 5,117,254 | 5/1992 | Kawashima et al. | 355/53 |
| 5,153,773 | 10/1992 | Muraki et al. . | |
| 5,160,962 | 11/1992 | Miura et al. | 355/53 |

FOREIGN PATENT DOCUMENTS 4-267515 9/1992 Japan .

*Primary Examiner*—David C. Nelms
*Assistant Examiner*—Que T. Le
*Attorney, Agent, or Firm*—Fitzpatrick, Cella, Harper & Scinto

[57] ABSTRACT

A projection exposure method and apparatus, in which high precision focus detection is assured even when the manner of illumination is changed. The projection exposure apparatus includes an illumination optical system for defining an illumination light source for illuminating an original having a pattern, the illumination optical system including a device for changing the shape of the illumination light source. The apparatus further includes a projection optical system for projecting an image of the pattern, illuminated by the illumination light source, to a surface to be exposed, a focus detecting system for detecting the state of focus of the original and the surface to be exposed, and an adjusting device for adjusting the focus detecting system in accordance with the change of the shape of the illumination light source by the changing device.

25 Claims, 11 Drawing Sheets

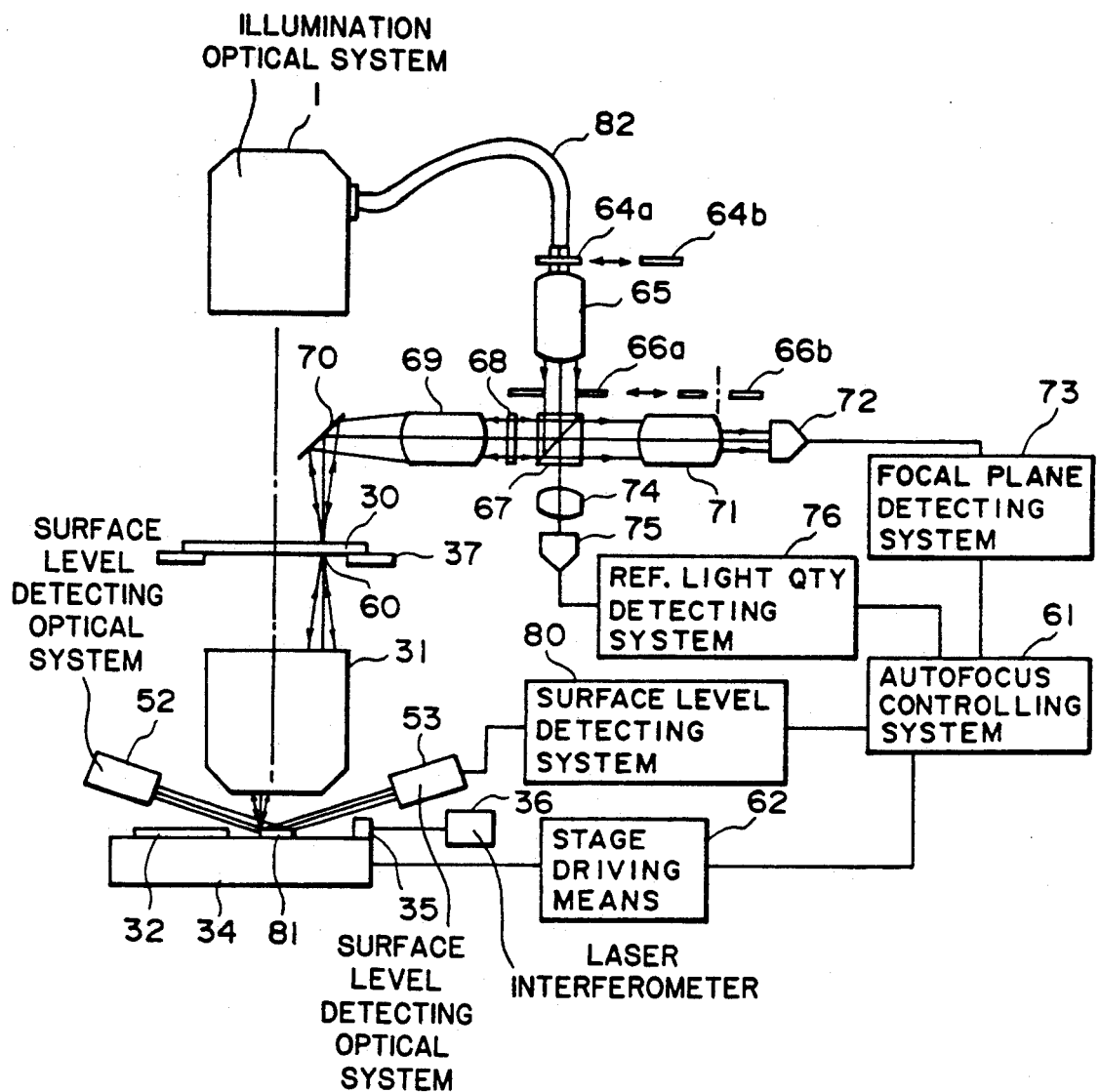
F I G. 1

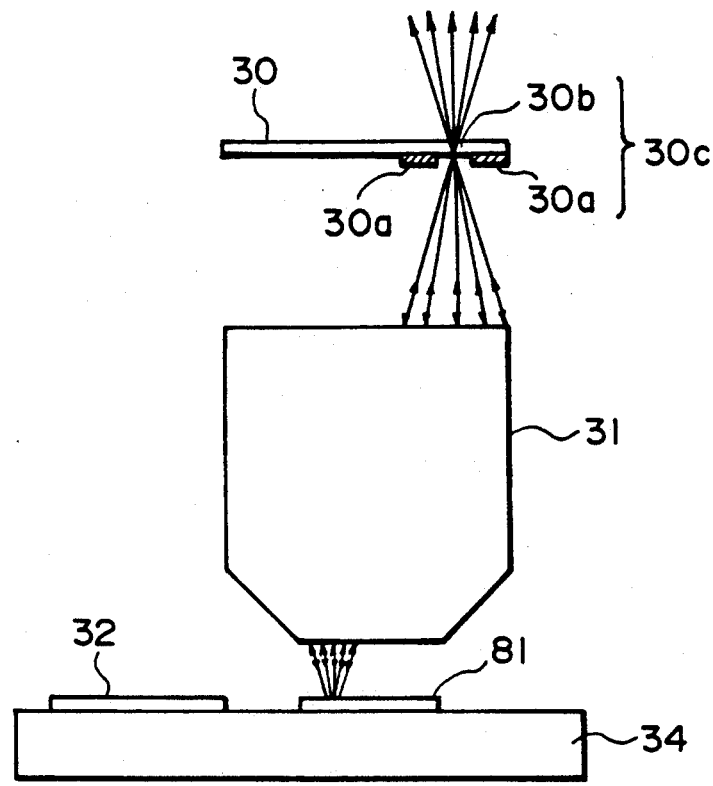
F I G. 7
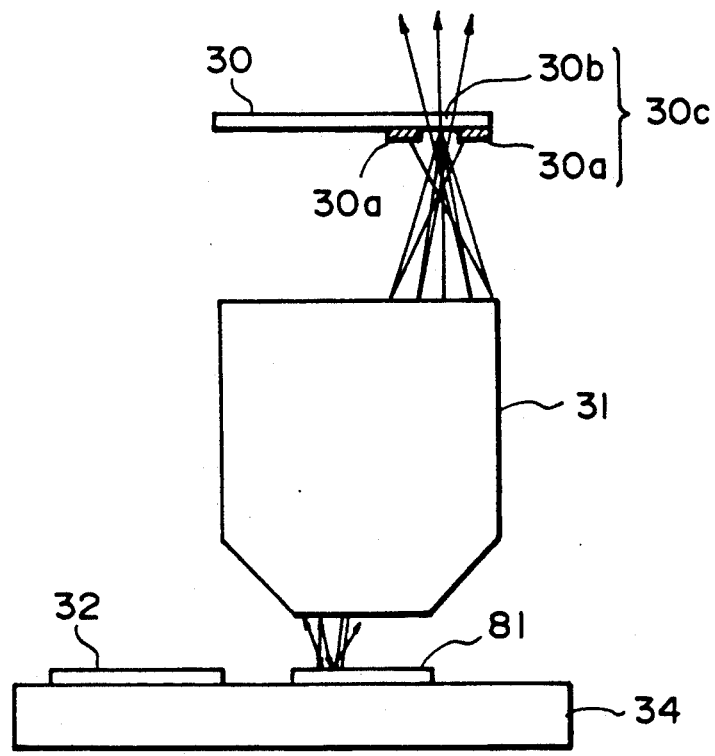
F I G. 8

PROJECTION EXPOSURE APPARATUS AND METHOD, A SEMICONDUCTOR DEVICE MANUFACTURING SYSTEM AND METHOD, AND A SEMICONDUCTOR DEVICE MANUFACTURED BY ILLUMINATING AN ORIGINAL HAVING A CIRCUIT PATTERN WHEN THE ORIGINAL AND A WAFER ARE IN A FOCUSED STATE

FIELD OF THE INVENTION AND RELATED ART

This invention relates to a projection exposure apparatus and, more particularly, to a projection exposure apparatus called a stepper usable in the manufacture of semiconductor devices and having a what can be called a TTL autofocusing function for automatically adjusting the focus when a circuit pattern of a reticle is repeatedly projected through projection exposure, onto a surface of a semiconductor wafer in a reduced scale.

Recent further miniaturization and the increasing degree of integration of a semiconductor device such as LSI or VLSI, has required the development of a projection exposure apparatus with an imaging (projecting) optical system having high resolution. This has forced enlargement of the NA (numerical aperture) which in turn has caused a decrease in the depth of focus of the imaging optical system.

It is therefore an important problem in a reduction type projection exposure apparatus to develop an effective high-precision autofocusing method for bringing the wafer surface into coincidence with the focal plane (image plane of the projection optical system).

In this type of projection exposure apparatus, the focus position (image plane position) is displaced with a change in ambience temperature or pressure around a projection optical system, a temperature rise due to light projected to the projection optical system or a temperature rise due to heat generation in the arrangement including the projection optical system. For correction of such focus position displacement, there has been developed a TTL autofocusing system using light passing through the projection optical system.

In such a TTL autofocusing system, for example, a mark formed on the surface of a reticle is imaged through the projection optical system upon a surface at the wafer side, and the mark image is observed by using an observation optical system above the reticle. From the contrast of the mark image, the state of focus is detected, and the result of detection is fed back to a wafer surface level detecting system, by which the wafer surface is controlled to a predetermined level to attain the correct focus.

Generally, a projection optical system of a stepper has aberration corrected very precisely. But, there remains a small wavefront aberration. Because of such remaining wavefront aberration, the focus position (focal point position) of the projection optical system is displaced with a change in $\sigma$ which is the ratio of the numerical aperture of the projection optical system to the numerical aperture of the illumination optical system.

Usually, a stepper has a $\sigma$ of about 0.4–0.6. To satisfy this requirement, illumination light to be used with a detection optical system of the TTL autofocusing system has a $\sigma$ of 0.4–0.6. In this way, high precision focus detection is assured.

An exposure method according to which an illumination device is appropriately structured to attain enhancement of resolution and an exposure apparatus using such exposure method, have been proposed in Japanese Pat. Application No. 28631/1991 assigned to the same assignee of the subject application. In a projection exposure apparatus according to an embodiment disclosed in this patent application, when a circuit pattern mainly composed of longitudinal and transverse patterns is illuminate and diffraction light caused by the circuit pattern is projected on a pupil of a projection optical system for projection of an image of the circuit pattern onto a wafer for transfer of the circuit pattern image onto the wafer, an effective light source is defined which has a light quantity distribution wherein the light intensity is higher at such portion other than the center of the pupil and than those portions on a pair of axes extending through the pupil center along the directions of elongation of the longitudinal and transverse patterns. By this arrangement, enhancement of resolution is assured.

In this type of projection exposure apparatus, if the manner of illumination is changed in accordance with the orientation of a pattern on a reticle or the linewidth of the pattern to be resolved, the path of light passing through the projection optical system changes. If this occurs, the projection optical system functions differently and the $\sigma$ level changes accordingly. This causes an error in the focus detection by a detection optical system of the TTL autofocusing system.

SUMMARY OF THE INVENTION

It is accordingly an object of the present invention to provide a projection exposure apparatus by which a focus change, due to a change in wavefront aberration caused by a change in the path of light passing through a projection optical system when the manner of illumination is changed, can be compensated in and by which high precision focus detection is assured.

It is another object of the present invention to provide a semiconductor device manufacturing method using such a projection exposure apparatus.

These and other objects features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a projection exposure apparatus according to an embodiment of the present invention.

FIG. 7 is a schematic view for explaining the state of focus of a projection optical system to a reference plane.

FIG. 8 is a schematic view for explaining the state of focus of a projection optical system to a reference plane.

DESCRIPTION OF THE PREFERRED EMBODIMENTS

Figure 2:
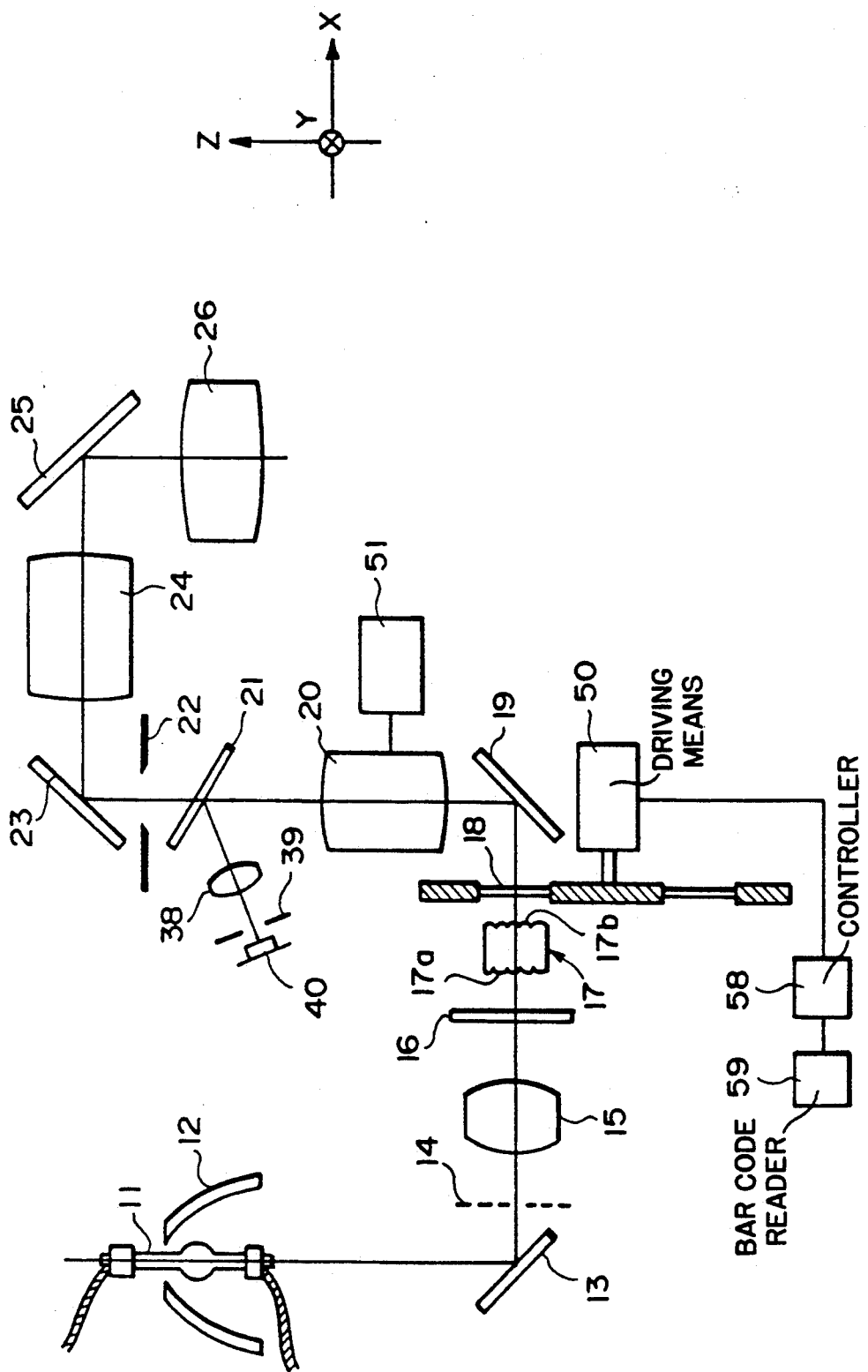
FIG. 2 is a schematic view of an illumination optical system of the apparatus of FIG. 1.

FIG. 1 shows the general structure of a projection exposure apparatus according to an embodiment of the present invention.

In the drawing, denoted at 30 is a reticle (photomask) which is an original. The reticle is supported by a reticle stage 37. A circuit pattern formed on the reticle 30 is imaged by projection exposure in a reduced scale of 1:5 by means of a projection optical system (reduction projection lens system) 31 upon a wafer 32 which is supported by an X-Y-Z stage (holding means) 34. Denoted at 35 is a mirror which is mounted on the stage 34 for reflecting light from a laser interferometer 36.

In FIG. 1, disposed adjacent to the wafer 32 is a reflective reference mirror 81 which has a surface at substantially the same level as the upper surface of the wafer 32. The surface of the reference mirror 81 is formed by a metal film of Cr or Al, for example. The X-Y-Z stage 34 is movable in the direction (Z direction) of the optical axis of the projection lens system 31 or in a plane (X-Y plane) orthogonal to that direction. Also, it can be rotationally moved about the optical axis. Illumination optical system 1 is provided to illuminate the reticle 30 so as to transfer the circuit pattern formed thereon onto the wafer 32.

Denoted at 52 and 53 are components of a surface level detecting optical system. The element 52 comprises a light projecting optical system for projecting a plurality of lights each comprising a non-exposure light with which a photoresist on the wafer is not sensitized. Each of these lights is collected on the reference mirror 81 (or upper surface of the wafer 32) and is reflected thereby.

The lights reflected by the reference mirror 81 enter the detection optical system 53 having a plurality of position detecting photoreceptors disposed to receive corresponding reflected lights. Each position detecting photoreceptor has a light receiving surface which is disposed to be optically conjugate with the point of reflection of a corresponding reflected light, upon the reference mirror 81, with respect to the imaging optical system 31. Any positional deviation of the reduction projection lens system 31 in the direction of the optical axis 31b can be measured as a positional deviation of light incident upon each position detecting photoreceptor of the detection optical system 53. More specifically, any positional deviation of the reference mirror 81 from a predetermined reference position is calculated, as the surface level, by a surface level detecting means on the basis of an output signals of the position detecting photoreceptors, and a corresponding signal is applied through a signal line to an autofocus control system 61.

The autofocus control system 61 serves to apply an instruction signal to a stage driving means 62 through a signal line so as to drive the X-Y-Z stage 34 on which the reference mirror 81 is fixed. Also, when the focus position of the projection lens 31 is to be detected by TTL, the autofocus control system 61 supplies an instruction signal to the stage driving means to drive the X-Y-Z stage so as to displace the reference mirror 81 vertically along the optical axis (Z direction) of the projection lens 31, in the neighbourhood of the preset reference position.

Next, referring to FIG. 2, details of the illumination optical system 1 of this embodiment will be explained.

Denoted at 11 is a light source (radiation source) comprising an ultra-high pressure Hg lamp, for example. The point of light emission of it is disposed adjacent to the first focal point of an elliptical mirror 12. The light produced by the lamp 11 is collected by the elliptical mirror 12. Denoted at 13 is a deflecting mirror, and denoted at 14 is a shutter for restricting the quantity of light to be passed. Denoted at 15 is a relay lens system for efficiently directing the light from the lamp 11 to an optical integrator 17 through a wavelength selecting filter 16. The optical integrator 17 comprises a plurality of small lenses arrayed two-dimensionally, to be described later, and has a light exit surface 17b which serves to define a secondary light source (secondary radiation source).

In this embodiment, the manner of imaging to the optical integrator 17 may be either under critical illumination or under Koehler illumination. Also, the exit port of the elliptical mirror 12 may be imaged on the optical integrator 17. The filter 16 serves to select and pass only a desired wavelength component or components out of the light from the Hg lamp 11.

Denoted at 18 is a stop shape adjusting member (selecting means) comprising a turret having plural stops of different aperture shapes and sizes, disposed after the optical integrator. The stop shape adjusting member 18 operates to select predetermined ones of the small lenses of the optical integrator 17 in accordance with the shape of the optical integrator 17. That is, in this embodiment, the manner of illumination suitable to the configuration of a pattern of a semiconductor integrated circuit, concerned, is selected and the exposure process is executed in the selected manner of illumination. Details of the selection of small lenses will be explained later.

Denoted at 19 is a mirror for deflecting the light path, and denoted at 20 is a lens system for collecting the light passing through the adjusting member 18. The lens system 20 plays an important role in providing uniformness of illumination. Denoted at 21 is a half mirror for dividing the light from the lens system 20 into reflected light and transmitted light. Of the divided lights, the light reflected by the half mirror 21 goes through a lens 38 and a pinhole 39 to a photodetector 40. The pinhole 39 is provided at a position which is optically equivalent to the reticle 30 having a pattern to be printed. The light passing through the pinhole 39 is detected by the photodetector 40, for controlling the amount of exposure.

Denoted at 22 is a mechanical blade called a masking blade, whose position can be adjusted by a driving system (not shown) in accordance with the size of the pattern region of the reticle 30 to be illuminated. Denoted at 34 is a mirror; denoted at 24 is a lens system; denoted at 25 is another mirror; and denoted at 26 is another lens system. These elements serve to illuminate the reticle 30 planed on the reticle stage 37 wit the light from the Hg lamp 11.

In this embodiment, the light exit surface 17a of the optical integrator 17 is substantially in an optically conjugate relationship with a pupil plane 31a of the projection optical system 31 (FIG. 1) with the intervention of the elements denoted at 19, 20, 23, 24, 25 and 26. Namely, an effective light source image (secondary radiation or an image thereof), corresponding to the light exit surface 17b, is formed on the pupil plane 31a of the projection optical system 31.

Figure 3:
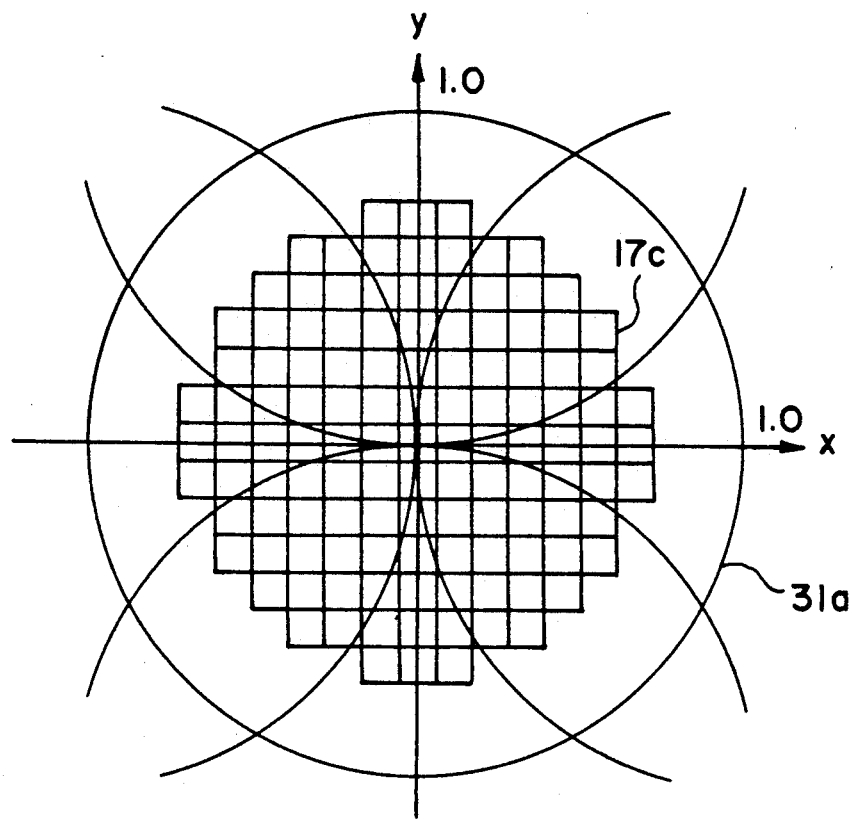
FIG. 3 is a schematic view for explaining the relationship between the pupil of a projection optical system and an optical integrator.

Referring now to FIG. 3, the relationship between the pupil plane 31a of the projection optical system 31 and the light exit surface 17a of the optical integrator 17 will be explained. The configuration of the optical integrator 17 corresponds to the configuration of the effective light source as formed on the pupil plane 31a of the projection optical system 31. This is shown in FIG. 3 wherein the shape of the effective light source image 17c on the light exit surface 17b as formed on the pupil plane 31a of the projection optical system 31 is illustrated superposedly. For standardization, the radius of the pupil 31a of the optical integrator 31 is taken as 1, and, within this pupil 31a the small lenses of the optical integrator 17 are imaged to form the effective light source image (secondary light source image) 17c. In this embodiment, each small lens of the optical integrator has a square shape.

Here, orthogonal coordinates which define the major directions to be used in design of a semiconductor integrated circuit are taken on x and y axes. These directions correspond to the major directions of the pattern formed on the reticle 30, and they substantially correspond to the directions of the outside configuration (square shape) of the reticle 30.

Generally, if the wavelength is denoted by $\lambda$, the parameter is denoted by $k_1$ and the numerical aperture is denoted by NA, then the resolution RP can be given by:

$$RP = k_1 \cdot \lambda / NA$$

The case wherein a high resolution illumination system provides its power is a case where the $k_1$ factor takes a level about 0.5.

In the present embodiment, in consideration thereof, under the influence of a particular stop of the adjusting member 18, only the light that passes through selected ones of the small lenses of the optical integrator 17, selected in accordance with the shape of the pattern on the reticle 30 surface, is used to illuminate the reticle 30.

More specifically, selection of small lenses is such that the light is allowed to pass through plural zones on the pupil plane 31a of the projection optical system 31, other than the central zone thereof.

Figure 4A:
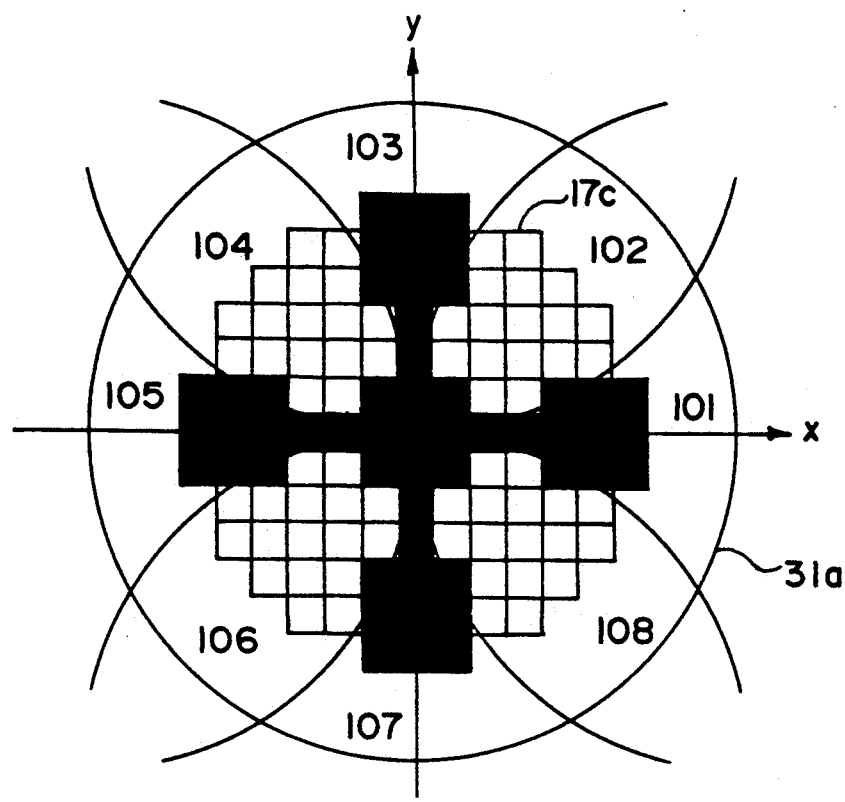
FIGS. 4A and 4B are schematic views each illustrating the pupil of the projection optical system.
Figure 4B:
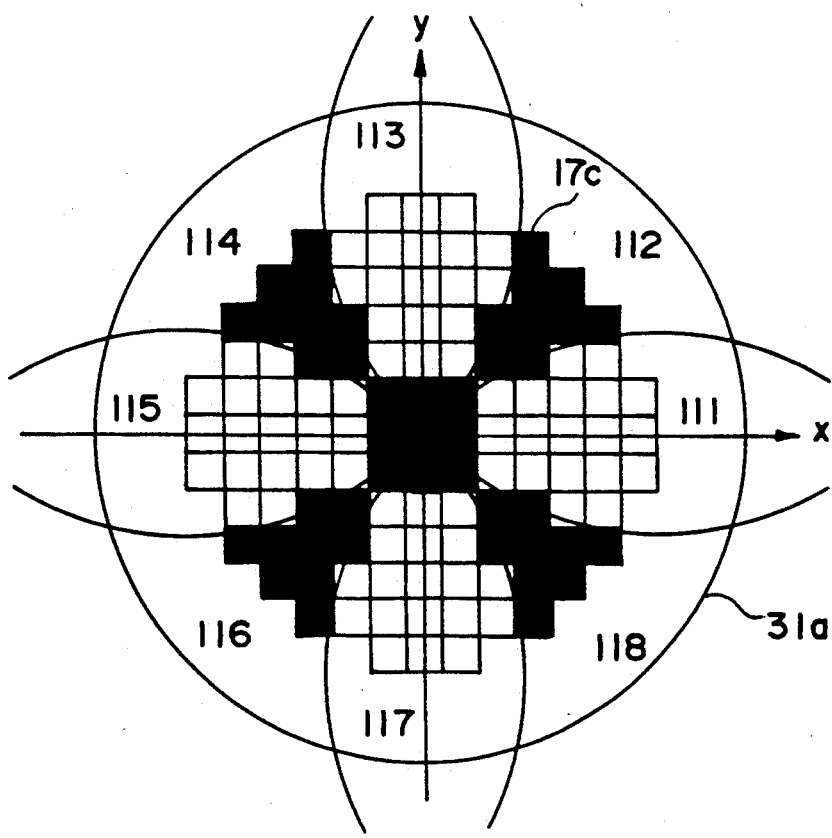

FIGS. 4A and 4B are schematic views each illustrating on the pupil plane 31a the manner of selection of light, passing through particular ones of the small lenses of the optical integrator 17 selected by a particular stop of the adjusting member 18. In these drawings, the painted areas depict light-blocked regions. The blank areas depict those regions to which the light come.

More specifically, FIG. 4A illustrates an effective light source image upon the pupil plane 31a to be defined in the case where resolution is required with respect to x and y directions. Assuming the circle representing the pupil 31a as $x^2 + y^2 = 1$, the following four circles should now be considered:

$$(x-1)^2 + y^2 = 1$$

$$x^2 + (y-1)^2 = 1$$

$$(x+1)^2 + y^2 = 1$$

$$x^2 + (y+1)^2 = 1$$

With these four circles, the circle representing the pupil 31a is divided into eight zones 101–108.

The illumination system of high resolution and deep depth of focus with respect to the x and y directions, is accomplished in this embodiment by selected projection, with priority, of the light to small lens groups in such zones denoted by reference numerals of even number, that is, the zones 102, 104, 106 and 108. Since the small lenses adjacent to the origin (x=0, y=0) are mainly contributable to enlarging the depth with respect to a rough pattern, whether those at the central portion are to be selected or not is a matter of selection to be determined by the pattern to be printed.

In the example of FIG. 4A, those small lenses around the center are excluded. The portion outside the optical integrator 17 is light-blocked by an integrator holding member (not shown) within the illumination system. In FIGS. 4A and 4B, for easy understanding of the relationship between the small lenses to be light-blocked and the pupil 31a of the projection lens, the pupil 31a and the effective light source image 17c of the optical integrator are drawn in superposition.

On the other hand, FIG. 4B illustrates the configuration of a stop to be used in the case where high resolution is required with respect to patterns of ±45 deg. Similarly to the FIG. 4A case, there is illustrated the relationship between the pupil 31a and the effective light source image 17c of the optical integrator 17. For such ±45 deg. patterns, under the same conditions as in the preceding case, the following four circles are to be considered:

$$(x - 1/\sqrt{2})^2 + (y - 1/\sqrt{2})^2 = 1$$

$$(x + 1/\sqrt{2})^2 (y - 1/\sqrt{2})^2 = 1$$

$$(x + 1/\sqrt{2})^2 + (y + 1/\sqrt{2})^2 = 1$$

$$(x - 1/\sqrt{2})^2 + (y - 1/\sqrt{2})^2 = 1$$

By drawing these four circles in superposition on the pupil 31a, like the FIG. 4A case, the pupil 31a is divided into eight zones 111–118. In this case, the zones which are contributable to enhancement of resolution to the ±45 deg. patterns are those zones denoted by reference numerals of odd number, that is, the zones 111, 113, 115 and 117. Thus, by selecting with priority those of the small lenses of the optical integrator 17 which present in these zones, to such ±45 deg. patterns the depth of focus is considerably enlarged at a $k_1$ factor of about 1.5.

Figure 5A:
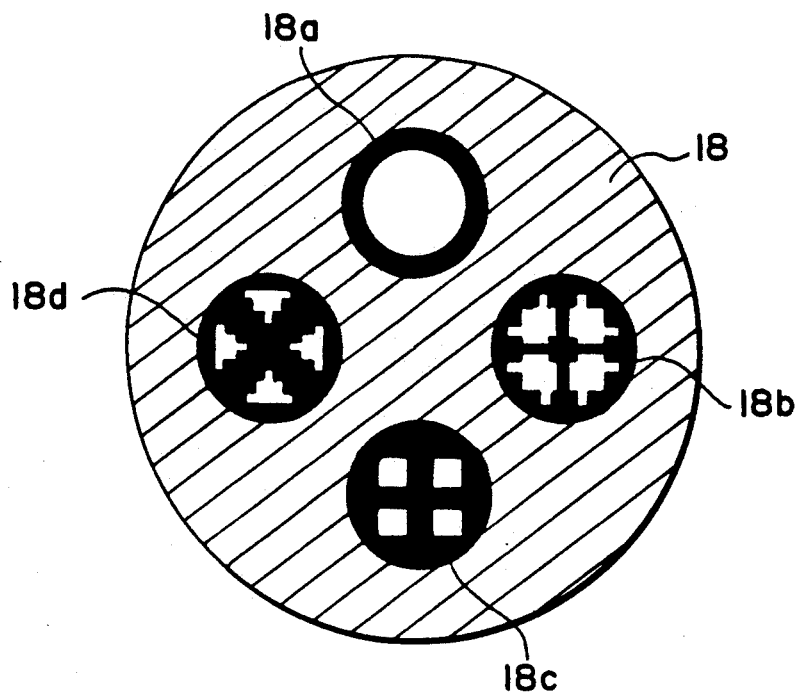
FIGS. 5A and 5B are schematic views each illustrating stops.

FIG. 5A illustrates an example of the stop shape adjusting member 18. As illustrated, a turret type stop interchanging system is adopted in this embodiment. A first stop 18a it to be used in a case where a pattern which is not so fine ($k_1$ is not less than 1) to be printed. The first stop 18a is of the same type as has been used in conventional illumination optical system, and it is a fixed stop and may be so set as to block the portion outside the small lenses of the optical integrator 17 as desired. Stops 18b–18d are selected in accordance with the type of a reticle pattern to be used.

Generally, in an illumination system for providing a high resolution, for a higher spatial frequency it is advantageous to use an outside region, upon the pupil plane, beyond the size of the optical integrator 17 as required in conventional illumination systems. For example, while it may be preferable in a conventional illumination system to use small lenses within a radius of 0.5, in an illumination system for high resolution it may be preferable to use those small lenses in a circle of a maximum radius of 0.75 although the small lenses in the central portion are not used.

In consideration of this, it is desirable to set the size of the optical integrator 17 as well as the effective diameter of the illumination system and the like while taking into account both the conventional type and the high resolution type. Further, it is desirable that the light intensity distribution at the light entrance end 17a of the optical integrator 17 has a sufficient size so that it can function well even if a stop member is inserted. The possibility of blocking outside small lenses by the stop 18a is for the reason described above. It may be possible that, while an optical integrator 17 prepared is provided with a radius up to 0.75, the stop 18a serves to select a portion within a radius 0.5.

Figure 5B:
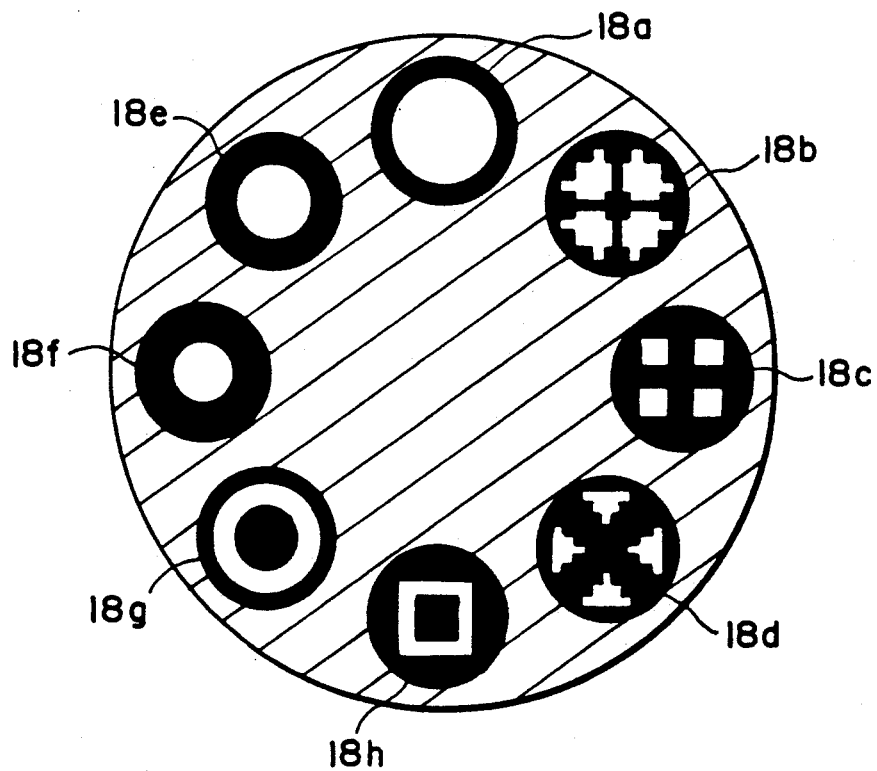

In this manner, the stop shape may be determined while taking into account the specificness of a pattern of a semiconductor integrated circuit to be manufactured and, by doing so, it is possible to provide an exposure apparatus best suited to the pattern. The selection of stops may be executed automatically under the influence of a control computer which may be provided to control the operation as a whole of the exposure apparatus. What is illustrated in FIG. 5A is an example of stop shape adjusting member formed with such stops and, in this example, a desired one of four types of stops 18a–18d can be selected. As a matter of course, the number of stops may be easily increased as desired. An example is illustrated in FIG. 5B. In this example stops 18a–18d are of the same structure as the those of FIG. 5A example. Stop 18e has an opening of a size smaller than the stop 18a. Stop 18f has an opening of further reduced size. Stop 18g has a ring-like opening having a central light blocking portion. Stop 18h has a rectangular ring-like opening.

There is a possibility that, when a stop is selected, the non-uniformness of illuminance changes with the selection of stop. In this embodiment, in consideration thereof, the non-uniformness of illuminance in that case may be adjusted by using the lens system 20. The non-uniformness of illuminance can be adjusted finely by adjusting the spacing or spacings of lens elements of the lens system 20 in the direction of its optical axis. Denoted at 51 is a driving mechanism for moving a or some lens elements of the lens system 20. The adjustment of the lens system 20 may be made in response to the selection of a stop. If desired, it may be possible to replace the lens system 20 itself by a different one in accordance with the stop shape adjustment. In that case, plural lens systems 20 may be prepared and may be interchangeably used in a turret fashion in response to the selection of a stop shape.

In this embodiment, as described, by changing the shape of stop, an illumination system suitable to the characteristic of a pattern of a semiconductor integrated circuit is selected. Another feature of this embodiment resides in that, when an illumination system for high resolution is selected, the formed effective light source comprise four separate zones. What is important in this case is the balance of intensity of these four zones. In the arrangement of FIG. 1, however, there is a possibility that the shadow of a cable to the Hg lamp 11 adversely affects the balance. In order to avoid this, it is preferable in the illumination system for high resolution which uses the stop means shown in FIG. 4 to connect the cable so that the linear shadow of the cable comes to the position of the small lenses of the optical integrator as light-blocked by the stop.

Figure 6:
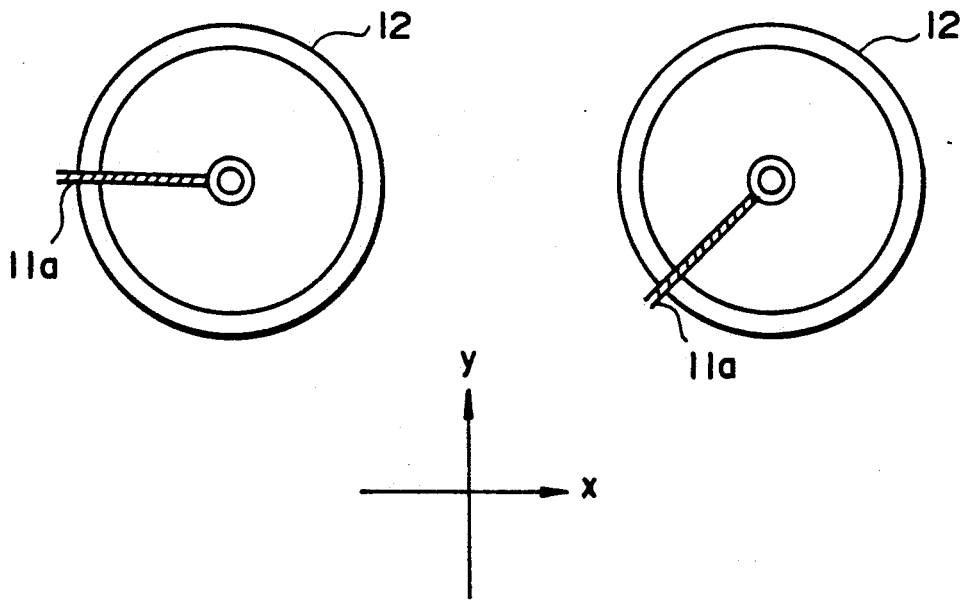
FIG. 6 is a schematic view for explaining the manner of connecting a cable to an ultra-high pressure Hg lamp.

Namely, in the example of FIG. 4A, it is preferable that the cable 11a is stretched in the x or y direction as illustrated in FIG. 6A. When the stop of FIG. 4B is used, it is preferable to that the cable 11a is stretched in a direction of ±45 deg. relative to the x or y direction as illustrated in FIG. 6B. In this embodiment, the direction of stretching the cable may be changed in accordance with the change of the shape of stop.

Next, the operation of detecting the focus position of the reduction projection lens 31 will be explained.

In FIGS. 7 and 8, denoted at 30 is a reticle, and denoted at 30a are pattern portions formed on the reticle having a property of blocking light. Denoted at 30b is a light transmitting Portion which is sandwiched between the pattern portions 30a. These pattern portions 30a and the light transmitting portion 30b cooperate to provide a focusing mark 30c. Here, for detection of the focus position (image plane position) of the reduction projection lens 31, the X-Y-Z stage 34 moves in the direction of the optical axis (Z direction) of the projection lens 34. The reflective reference mirror 81 is positioned just below the projection lens 31, and the pattern portions 30a and the light transmitting portion 30b of the reticle 30 are illuminated by an autofocusing illumination optical system.

This autofocusing illumination optical system has a such structure to be described below. As shown in FIG. 1, a portion of light of the same wavelength as the exposure light from the exposure illumination optical system 1, is guided by an optical fiber 82 to a collimator lens 65 as a detection beam, and it illuminates an aperture stop 66a. The aperture stop 66a can be interchanged by one of different aperture stops 66b automatically or manually in response to the change of shape of the secondary radiation source of the illumination optical system 1 as described hereinbefore.

Denoted at 64a is a light quantity controlling ND filter which can be interchanged by one of different ND filters in response to the replacement of the aperture stop 66a by another (66b) so at to maintain constant light quantity. The light passing through the aperture stop 66a is divided by a polarization beam splitter 67 into an S-polarized beam which is directed via a quarter waveplate 68, an objective lens 69 and a mirror 70 to illuminate the reticle, and a P-polarized light which goes through a condensing lens 74 and is incident on a photoreceptor 75 of a reference light quantity detecting system.

The detection beam for illuminating the reticle 30 is set to provide light of the same NA as the NA of the illumination optical system 1 for the exposure process, this being accomplished by the shape and size of the aperture stop 66a or 66b. If the NA of the illumination optical system for the exposure process is changed by, for example, using one of stops shown in FIG. 5, both the aperture stop 66 and the ND filter 64 are interchanged. This assures constant operation of the projection optical system 31.

The detection beam passing through the reticle 30 and the projection optical system 31 and comprising S-polarized light, is reflected by the reference mirror 81 and goes back along its oncoming path. Here, under the influence of the quarter waveplate 68, it is transformed into S-polarized light. As a result, it passes through the polarization beam splitter 67 and, after passing through a relay lens 71, it impinges on a photoreceptor 72 of focus detecting means. The photoreceptor 72 serves to detect the imaging state of the image of the pattern 30a upon the reference mark 81.

If the radiation source produces a largely changing output, the output signal of the photoreceptor 72 is divided by the output signal of a photoreceptor 75, monitoring an intensity change, and the resultant is used as the focus detecting output. If not, the output of the photoreceptor 72 is used directly.

In this embodiment, the aperture stop 66 and the objective lens 69 and the like define an optical system for supplying a variable shape secondary light source for directing the detection beam to the predetermined pattern 30a, so that a secondary light source image. Substantially the same as the secondary light source image as formed by the illumination optical system 1 on the pupil of the projection optical system, is projected on the pupil of the projection optical system.

As regards the practical shape of the opening of the aperture stop 66, those like the ones illustrated in FIG. 5, for the shape of the opening of the stop 18 of the illumination optical system 1, are prepared, and such an opening of a shape analogous to that of the opening of the stop 18 is selected.

Namely, in this embodiment, while changing the aperture diameter of shape of the aperture stop 66 under the same condition as the condition of illumination, in the exposure process, of the reticle 30 by the illumination optical system, the autofocusing illumination light is produced and, by using such light, the autofocusing pattern 30 a is illuminated. By this arrangement the TTL autofocusing operation can be executed under the same condition as the operation of the projection optical system in the exposure process, and thus a detection error resulting from a change in ambient condition can be reduced, whereby high precision focus detection is assured.

FIG. 7 shows a case where the reference mirror 81 is just on the focal plane of the reduction projection lens 31. The detection beam passing through the light transmitting portion 30b of the reticle 30 goes through the projection lens 31 and is collected on the reference mirror 81, whereby it is reflected. The reflected light goes back along its oncoming path and is collected on the reticle 30. The light goes through the light transmitting portion 30b between the pattern portions 30a of the reticle. Here, all the light can pass the pattern portions 30a of the reticle without being eclipsed thereby.

On the other hand, FIG. 8 shows a case where the reference mirror 81 is at a position deviated from the focal plane of the reduction projection lens 31. In this state, since the reference mirror 81 is out of the focal plane of the projection lens 31, the detection beam passing through the light transmitting portion of the pattern portions 30a of the reticle is reflected by the reference mirror 81 as a diverging light. As a result, the reflected light goes back along a path different from its oncoming path and, after passing through the projection lens, it impinges on the reticle 30 without being collected, namely, in the form of diverging light having divergence corresponding to the amount of deviation of the reference mirror 81 from the focal plane of the projection lens 31. Here, the light is partially eclipsed by the pattern portions 30a of the reticle 30, and all the light cannot pass through the light transmitting portion 30b. Namely, there occurs a difference in reflected light quantity (reflected light intensity) between a case where the reference mirror 81 coincides with the focal plane and a case where the former is out of coincidence with the latter.

Next, description will be provided on the details of the manner of detecting the focus position (image plane position) of the reduction projection lens 31 by using a result of dividing the output signal or output of the photoreceptor 72 by the output of the photoreceptor 75.

Figure 9:
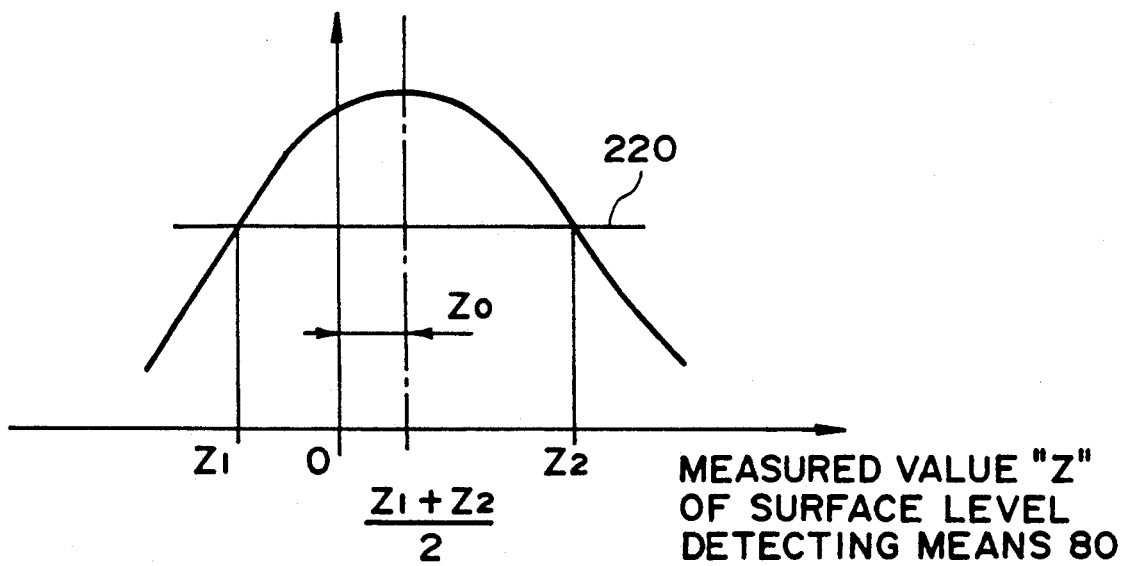
FIG. 9 is a graph showing the relationship between the surface level and an output signal from a surface level detecting system.

First, by using the stage driving means 62, the X-Y-Z stage 34 having the reference mirror 81 mounted thereon is moved in the direction of the optical axis of the projection lens 31, about the zero point which is preset by the surface level detecting means 80. During this motion, at some points the position of the reference mirror 81 in the direction of the optical axis is monitored. A measured value obtained at one of these points, close to the portion at which the image of the focusing mark 30c is projected by the focus position detecting system, is taken as "z", and this is used as the position of the reference mirror 81. FIG. 9 shows the relationship between this "z" and the signal output of the focal plane detecting system 73 obtained when the light reflected by the reference mirror 81 is received by the photoreceptor 72. When the reference mirror 81 is on the focal plane (image plane) of the projection lens 31, the output of the focal plane detecting system 73 comes to a peak. The value z0 of the surface level detecting system 80 at this moment is taken as the focus position of the projection lens system 31 for the projection exposure of the wafer 32 by this projection lens 31.

The thus determined focus position of the projection lens 31 serves as a reference position for the autofocus detection system. The optimum position in the practical wafer printing operation is determined by applying to this reference position an offset to be determined by the coating thickness of the wafer, the height of a stepped structure on the wafer and the like.

To the method of detecting the focus position z0 by using the signal output a illustrated in FIG. 9, the following may be applied:

(a) An autofocus measured value z0 at a moment when the light quantity output is highest may be used as the focus position.

(b) A slice level 220 of a certain proportion to the peak output may be set and, by detecting autofocus measured values z1 and z2 showing an output of this slice level 220, the focus position may be determined as $z0=(z1+z2)/2$.

(c) To the light quantity output (fi) and the autofocus measured value (zi), gravity center processing may be made, and the focus position may be determined as $$z0 = \left[ \sum_{}^{n} (zi \times fi) \right] / \sum_{}^{n} fi.$$

(d) To the light quantity output (fi) and the autofocus measured value (zi), a quadratic function approximation ($y = a \cdot x \cdot x + bx + c$) may be made, and the focus position may be determined as $z0 = -b/2a$.

Figure 10:
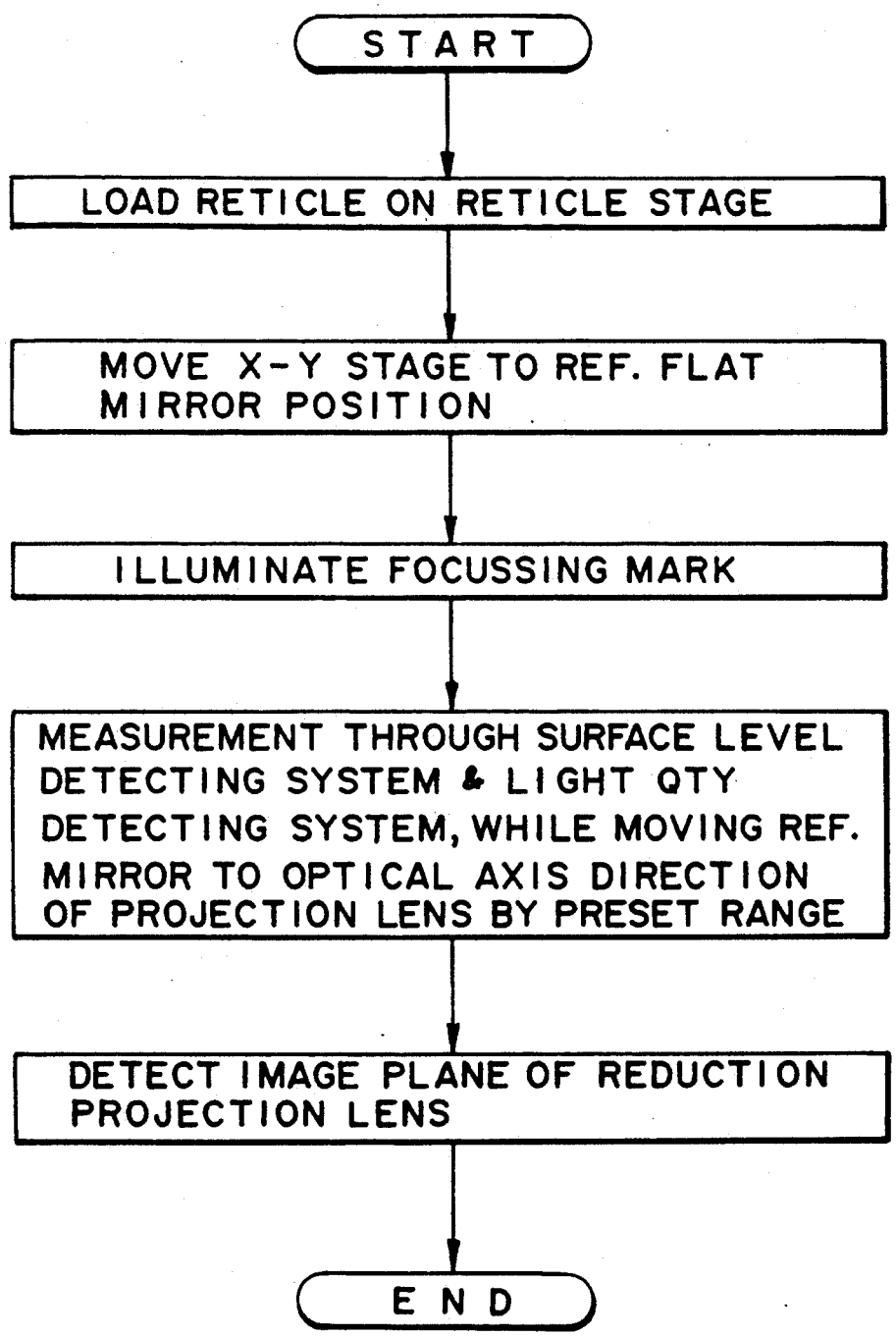
FIG. 10 is a flow chart for explaining the sequence of a focal plane detecting process.

FIG. 10 is a flow chart showing the sequence of focal plane detecting process described above.

In the embodiment described above, the detection beam is projected to the reference mirror 81 provided in the neighbourhood of the wafer for detection of the state of focus between the mask and the wafer, the detection beam may be projected to the wafer surface.

Further, in place of using the reference mirror 81, a photodetector array such as CCD or a detector such as a position sensor may be disposed at the position of the reference mirror 81, and the output of such a detector may be used to determine the state of focus between the mask and the wafer.

In the embodiment described above, the projection optical system 31 comprises an exit side telecentric system. Because of this, the chief ray at the entrance side is inclined, and preferably the illumination light in exposure process may be inclined accordingly. In that occasion, the light for TTL autofocusing may preferably inclined similarly by shifting the aperture stop 66 laterally along a direction perpendicular to the optical axis. Since in that case the amount of inclination of the chief ray at the entrance side changes depending on the position within the image plane, it may be preferable to change the amount of shift of the aperture stop 66.

Further, in the embodiment described above, a bar code may be provided in a portion of the reticle R as illustrated in FIG. 2 and this bar code may be read by a bar code reader (input means) 59, so as to obtain the information regarding the shape or resolution or the like of the pattern formed on the reticle. The obtained information may be supplied to a controller 58. On the basis of the pattern information from the input means 59, the controller may discriminate a best intensity distribution for the secondary light source and, on the basis of this, it may drive-control the driving means 50 and select the type of the aperture stop 66 to thereby provide an intensity distribution such as shown in FIG. 4A or 4B.

Figure 11:
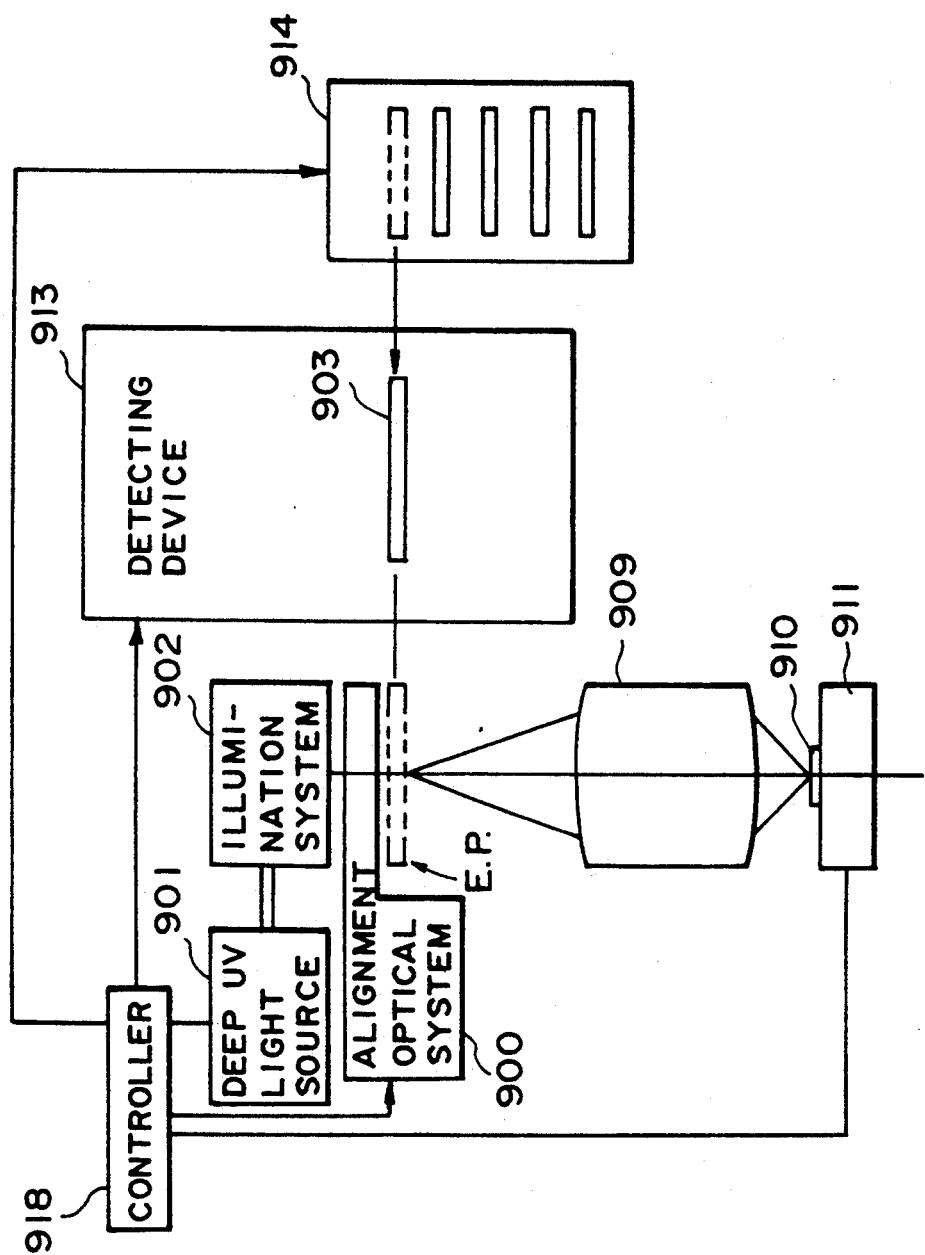
FIG. 11 is a schematic view of a semiconductor device manufacturing system.

FIG. 11 shows an embodiment of a semiconductor device manufacturing system for printing a circuit pattern of an original such as a reticle or photomask on a silicon wafer. Generally, it comprises an exposure apparatus (of the type as described hereinbefore), an original storing device, an original inspecting device and a controller, all being placed in a clean room.

Denoted at 901 is a deep UV light source such as an excimer laser. Denoted at 902 is an illumination system unit having a structure for changing the shape of illumination light source in accordance with a circuit pattern, as described hereinbefore. It serves to illuminate an original, placed at the exposure position EP at once from the above, with a suitable NA (numerical aperture). Denoted at 909 is a projection optical system for transferring the circuit pattern of the original onto a silicon wafer 910. It comprises an ultra-high resolution lens system (or mirror system). During the printing operation, zones of the wafer are exposed sequentially while the wafer is moved stepwise by the stepwise motion of a movable stage 911. Denoted at 900 is an alignment optical system for aligning the original and the wafer prior to the exposure operation. It comprises at least one original observing microscope system. The exposure apparatus is composed of those elements described above.

On the other hand, denoted at 914 is the original storing device for storing plural originals therein. Denoted at 913 is the original inspecting device for inspecting presence of any foreign particle or the like on an selected original taken out of the original storing device, before it is placed at the exposure position EP. The controller 918 is provided to control the sequence of the system as a whole. More specifically, it serves to control the operation of the original storing device 914 and the original inspecting device 913, as well as the alignment and exposure operation and the wafer stepwise feeding operation which are basic operations of the exposure apparatus.

The semiconductor device manufacturing process using the system of this embodiment will be explained. First, an original to be used is off-loaded out of the original storing device 914. Then, it is placed in the inspecting device 913 and the inspection of any foreign particle or the like on the original is effected. If the absence of such foreign particle is discriminated by the inspection, the original is then placed at the exposure station EP. Subsequently, a silicon wafer 910 which is the object to be exposed is placed on the movable stage 911. Then, while moving the wafer stepwise through stepwise motion of the movable stage 911, the pattern of the original is printed by reduction projection exposure onto the zones of the wafer sequentially. After exposure of one wafer is completed, the exposed wafer is off-loaded and another wafer is supplied, and a similar step-and-repeat exposure operation is made to this wafer.

Exposed silicon wafer is fed into separate processing devices wherein a developing process, an etching process and so on are executed. Subsequently, the processed wafer is subjected to a dicing process, a wire bonding process, a packaging process and so on, whereby semiconductor devices are manufactured.

Next, an embodiment of semiconductor device manufacturing method using the exposure apparatus described above will be explained.

Figure 12:
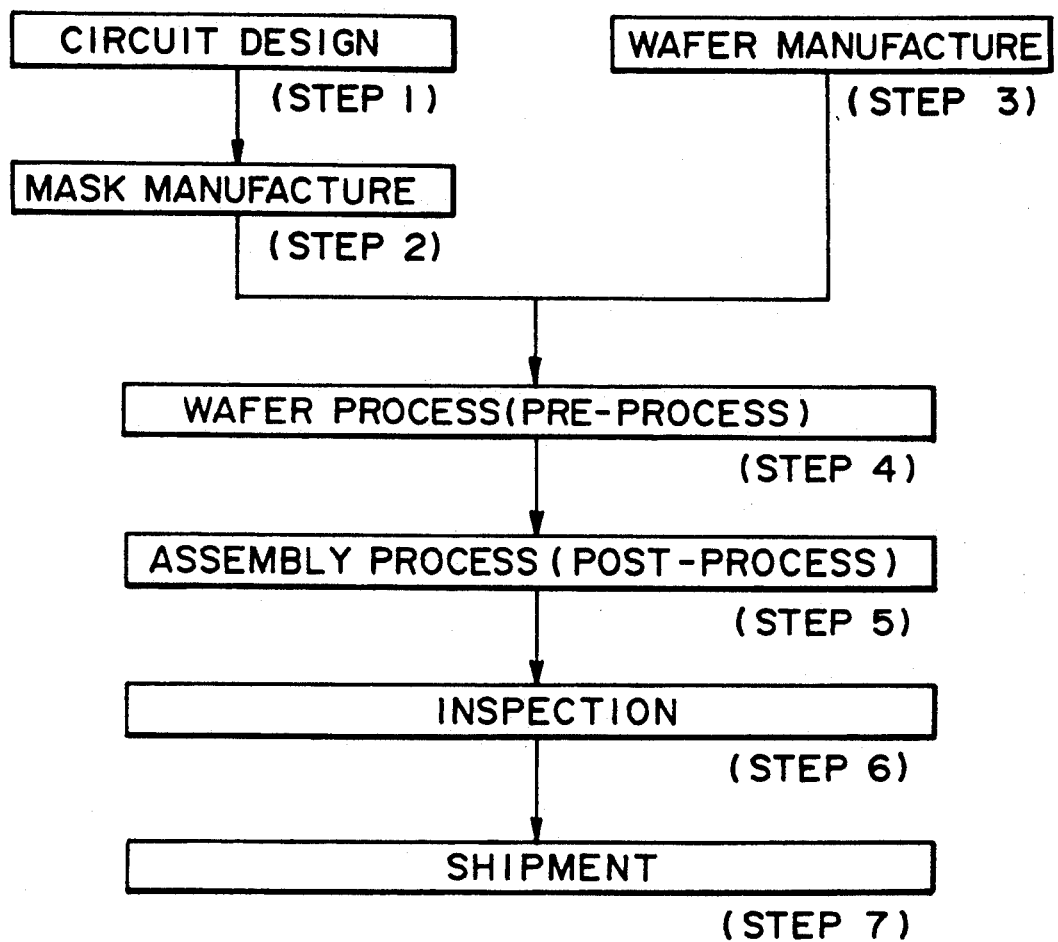
FIG. 12 is a flow chart for explaining the semiconductor device manufacturing process.

FIG. 12 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 13:
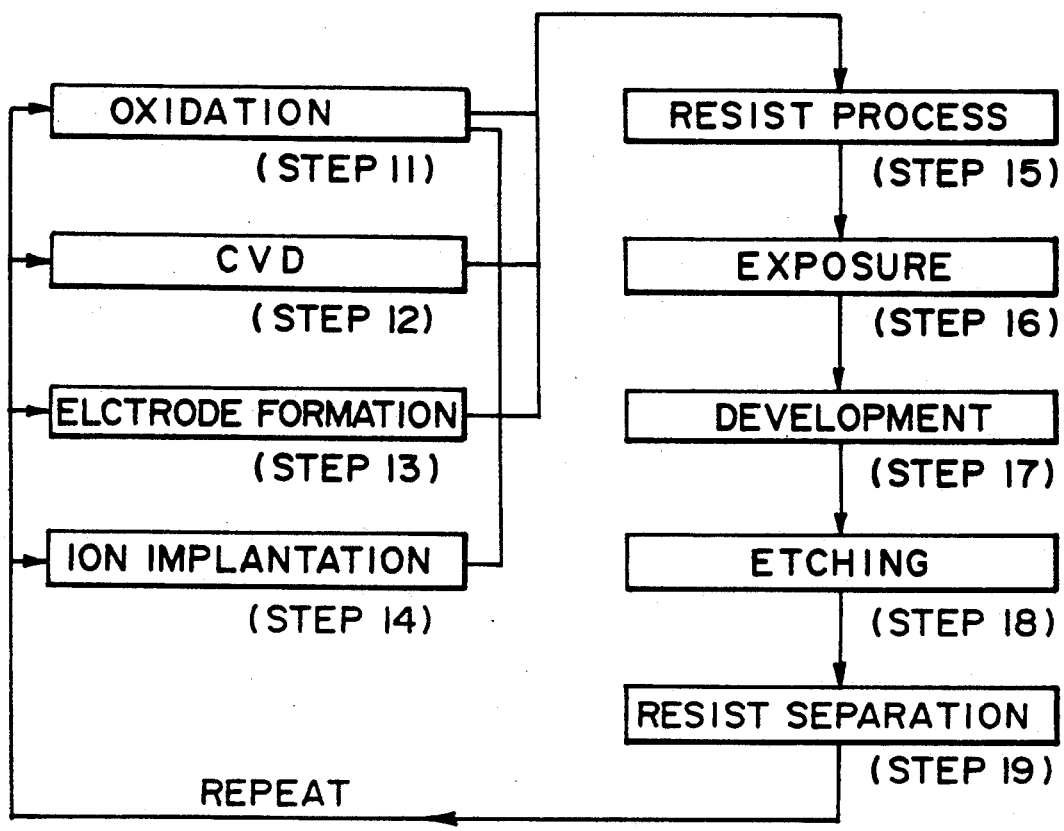
FIG. 13 is a flow chart for explaining details of a wafer making process.

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination optical system for defining an illumination light source for illuminating an original having a pattern, said illumination optical system including means for changing the shape of said illumination light source;
   a projection optical system for projecting an image of the pattern, illuminated by said illumination light source, to a surface to be exposed;
   a focus detecting system for detecting the state of focus of the original and the surface to be exposed; and
   adjusting means for adjusting said focus detecting system in accordance with the change of the shape of said illumination light source by said changing means.

2. An apparatus according to claim 1, wherein said focus detecting system includes a projecting system for projecting a detection beam to a predetermined pattern so that an image of the predetermined pattern is projected through said projection optical system to a position adjacent to the surface to be exposed, and wherein said adjusting means includes an adjusting member for changing the state of the detection beam in accordance with the change of the shape of the illumination light source by said changing means.

3. An apparatus according to claim 1, wherein said illumination optical system includes a radiation source and an optical integrator and wherein said illumination light source is defined after said optical integrator as secondary light source.

4. An apparatus according to claim 1, wherein said changing means includes means for selecting a desired one of plural shapes prepared for said illumination light source.

5. An apparatus according to claim 4, wherein said changing means includes a turret having different stop members each for determining the shape of said illumination light source.

6. An apparatus according to claim 4, wherein one of said shapes for said illumination light source is effective to define a light source portion on an optical axis.

7. An apparatus according to claim 4, wherein one of said shapes for said illumination light source is effective to define a light source portion off an optical axis.

8. An apparatus according to claim 7, wherein said one shape is effective to define a substantially circular ring-like shape around the optical axis.

9. An apparatus according to claim 7, wherein said one shape is effective to define a substantially rectangular ring-like shape around the optical axis.

10. An apparatus according to claim 7, wherein said one shape is effective to define separate light source portions in four quadrants, respectively, of orthogonal coordinates defined with its origin on the optical axis.

11. An apparatus according to claim 10, wherein the pattern of the original is elongated in a direction and wherein an axis of said orthogonal coordinates substantially corresponds to said direction.

12. An apparatus according to claim 2, wherein the image of the predetermined pattern is projected on a reflective surface provided adjacent to the surface to be exposed.

13. An apparatus according to claim 2, wherein the image of the predetermined pattern is projected on the surface to be exposed.

14. An apparatus according to claim 2, wherein the image of the predetermined pattern is projected on a light receiving surface of a detector provided adjacent to the surface to be exposed.

15. An apparatus according to claim 2, wherein the detection beam has the same wavelength as that of light from said illumination light source.

16. An apparatus according to claim 2, wherein said adjusting means includes means for changing the shape of the detection beam upon a pupil of said projection optical system.

17. An apparatus according to claim 2, wherein said adjusting means includes means for changing the intensity of the detection beam.

18. An apparatus according to claim 1, further comprising input means for inputting information, representing the type of the original, into said apparatus, and wherein said changing means changes the shape of said illumination light source on the basis of the inputted information.

19. An apparatus according to claim 18, wherein said input means comprises a bar code reader for reading a bar code provided on the original.

20. A projection exposure method, comprising the steps of:
   changing the shape of an illumination light source for illuminating an original having a pattern, in accordance with the pattern;
   detecting the state of focus of the original and a surface to be exposed in a manner suited to the changed shape of the illumination light source; and
   illuminating the original with the light from the illumination light source when the original and the surface to be exposed are in a focused state, to thereby transfer the pattern of the original to the surface.

21. A method according to claim 20, wherein said detecting step comprises the steps of projecting a detection beam to a predetermined pattern provided on the original so that an image of the predetermined pattern is projected through a projecting optical system to a position adjacent to the surface to be exposed, and changing the state of the detection beam in accordance with the changed shape of the illumination light source.

22. A semiconductor device manufacturing system, comprising:
   an inspecting device for inspecting an original having a circuit pattern; and
   a projection exposure apparatus which includes (i) an illumination optical system for defining an illumination light source for illuminating an original having a pattern, said illumination optical system including means for changing the shape of said illumination light source, (ii) a projection optical system for projecting an image of the pattern, illuminated by said illumination light source, to a surface to be exposed, (iii) a focus detecting system for detecting the state of focus of the original and the surface to be exposed, and (iv) adjusting means for adjusting said focus detecting system in accordance with the change of the shape of said illumination light source by said changing means.

23. A semiconductor device manufacturing method, comprising the steps of:
    preparing an original having a circuit pattern and a wafer;
    changing the shape of an illumination light source for illuminating the original in accordance with the circuit pattern;
    detecting the state of focus of the original and a wafer in a manner suited to the changed shape of the illumination light source; and
    illuminating the original with the light from the illumination light source when the original and the wafer are in a focused state, to thereby transfer the circuit pattern of the original to the wafer.

24. A method according to claim 23, further comprising the step of inspecting the prepared original.

25. A semiconductor device manufactured by a process which includes:
    preparing an original having a circuit pattern and a wafer;
    changing the shape of an illumination light source for illuminating the original in accordance with the circuit pattern;
    detecting the state of focus of the original and a wafer in a manner suited to the changed shape of the illumination light source; and
    illuminating the original with the light from the illumination light source when the original and the wafer are in a focused state, to thereby transfer the circuit pattern of the original to the wafer.

* * * * *

UNITED STATES PATENT AND TRADEMARK OFFICE
CERTIFICATE OF CORRECTION

PATENT NO. : 5,286,963
DATED : February 15, 1994
INVENTOR(S) : MAKOTO TORIGOE

It is certified that error appears in the above-indentified patent and that said Letters Patent is hereby corrected as shown below:

COLUMN 1:

Line 37, "system" should read --system,--.
Line 58, "$\sigma$" should read --$\sigma$,--.

COLUMN 2:

Line 8, "illuminate" should read --illuminated--.
Line 37, "in" should read --for--.
Line 42, "objects" should read --objects,--.

COLUMN 3:

Line 63, "an" should be deleted.

COLUMN 4:

Line 67, "wit" should read --with--.

COLUMN 6:

Line 63, "it" should read --is--.

UNITED STATES PATENT AND TRADEMARK OFFICE
CERTIFICATE OF CORRECTION

PATENT NO. : 5,286,963
DATED : February 15, 1994
INVENTOR(S) : MAKOTO TORIGOE

It is certified that error appears in the above-indentified patent and that said Letters Patent is hereby corrected as shown below:

COLUMN 7:

Line 40, "example" (2nd occurrence) should read --example,--.

COLUMN 8:

Line 2, "comprise" should read --comprises--.
    Line 51, "at" should read --as--.

COLUMN 9:

Line 24, "image." should read --image,--.
    Line 25, "Substantially" should read --substantially--.
    Line 41, "pattern 30 a" should read -- pattern 30a--.
    Line 41, "arrangement" should read --arrangement,--.

COLUMN 10:

Line 49, "a" should read --as--.

UNITED STATES PATENT AND TRADEMARK OFFICE
CERTIFICATE OF CORRECTION

PATENT NO. : 5,286,963
DATED : February 15, 1994
INVENTOR(S) : MAKOTO TORIGOE

It is certified that error appears in the above-indentified patent and that said Letters Patent is hereby corrected as shown below:

COLUMN 11:

Line 9, "neighbourhood" should read --neighborhood--.
Line 23, "may" should read --may be--.

COLUMN 13:

Line 49, "as" should read --as a--.

COLUMN 14:

Line 48, "exposed" should read --exposed,--.
Line 58, "projecting" should read --projection--.

Signed and Sealed this

Twenty-third Day of August, 1994

Attest:

BRUCE LEHMAN

Attesting Officer

Commissioner of Patents and Trademarks